(12) United States Patent
Akiyama

(10) Patent No.: US 6,625,337 B2
(45) Date of Patent: Sep. 23, 2003

(54) WAVELENGTH-DIVISION MULTIPLEX OPTICAL SIGNAL PROCESSOR AND A METHOD OF REGENERATING A WAVELENGTH-DIVISION MULTIPLEXED OPTICAL SIGNAL

(75) Inventor: Tomoyuki Akiyama, Tsukuba (JP)

(73) Assignee: Fujitsu Limited, Kawasaki (JP)

( * ) Notice: Subject to any disclaimer, the term of this patent is extended or adjusted under 35 U.S.C. 154(b) by 313 days.

(21) Appl. No.: 09/755,025

(22) Filed: Jan. 8, 2001

(65) Prior Publication Data
US 2001/0028755 A1 Oct. 11, 2001

(30) Foreign Application Priority Data

Mar. 10, 2000 (JP) .......................... 2000-067790

(51) Int. Cl.[7] .................................................. G02B 6/12
(52) U.S. Cl. .......................................... 385/14; 385/24
(58) Field of Search .......................... 385/14, 24, 122, 385/129–132

(56) References Cited

U.S. PATENT DOCUMENTS 6,294,794 B1 * 9/2001 Yoshimura et al. ........... 257/14

2002/0051615 A1 * 5/2002 Walpole et al. ............. 385/131
2002/0079485 A1 * 6/2002 Stintz et al. .................. 257/14
2003/0073258 A1 * 4/2003 Mukai et al. ................. 438/29

FOREIGN PATENT DOCUMENTS

| JP | 10084164 A | * 3/1998 | ............. H01S/3/18 |
| JP | 11231272 A | * 8/1999 | ........... G02F/1/015 |
| JP | 20012555500 A | * 9/2001 | ........... G02F/1/017 |

OTHER PUBLICATIONS

Akiyama et al. Application of Spectral–Hole Burning in the Inhomogeneously Broadened Gain of Self–Assembled Quantum Dots to a Multiwavlength–Channel Nonlinear Optical Device. IEEE Photonics Technology Letters, vol. 12, No. 10, pp1301–1303. Oct. 2000.*

* cited by examiner

Primary Examiner—Brian Healy
Assistant Examiner—Sarah U Song
(74) Attorney, Agent, or Firm—Armstrong, Westerman & Hattori, LLP

(57) ABSTRACT

An optical processor of a wavelength-division multiplex optical signal includes a non-linear optical device having an active layer containing therein a number of self-organized quantum dots with respective absorption wavelengths. The quantum dots collectively form a continuous optical absorption spectrum in the wavelength range of the wavelength-division multiplex optical signal.

11 Claims, 16 Drawing Sheets

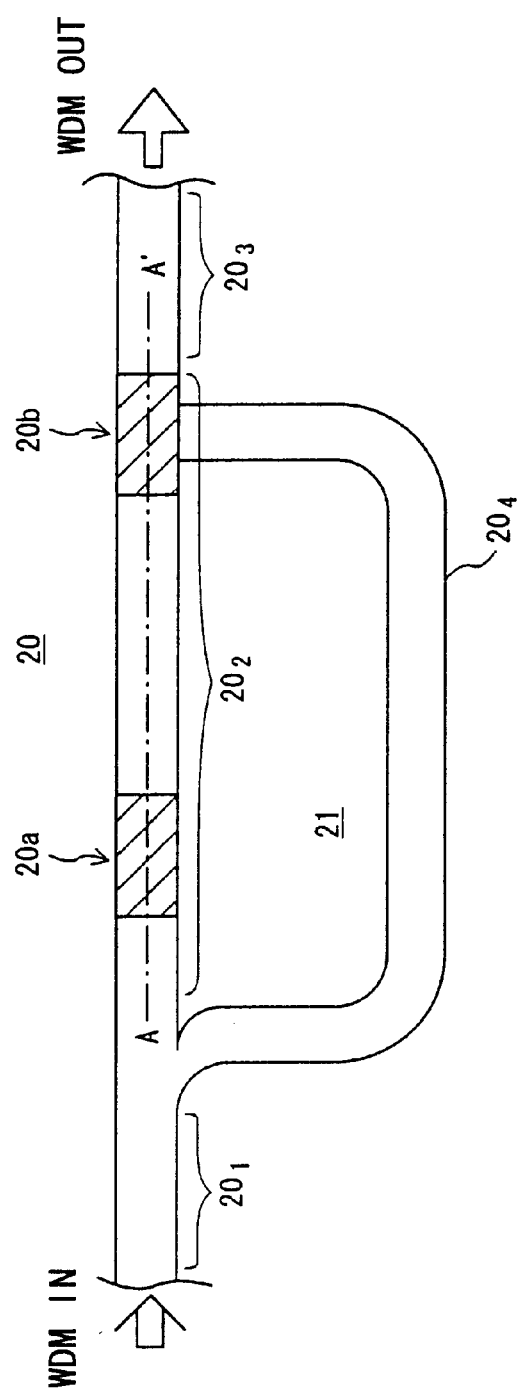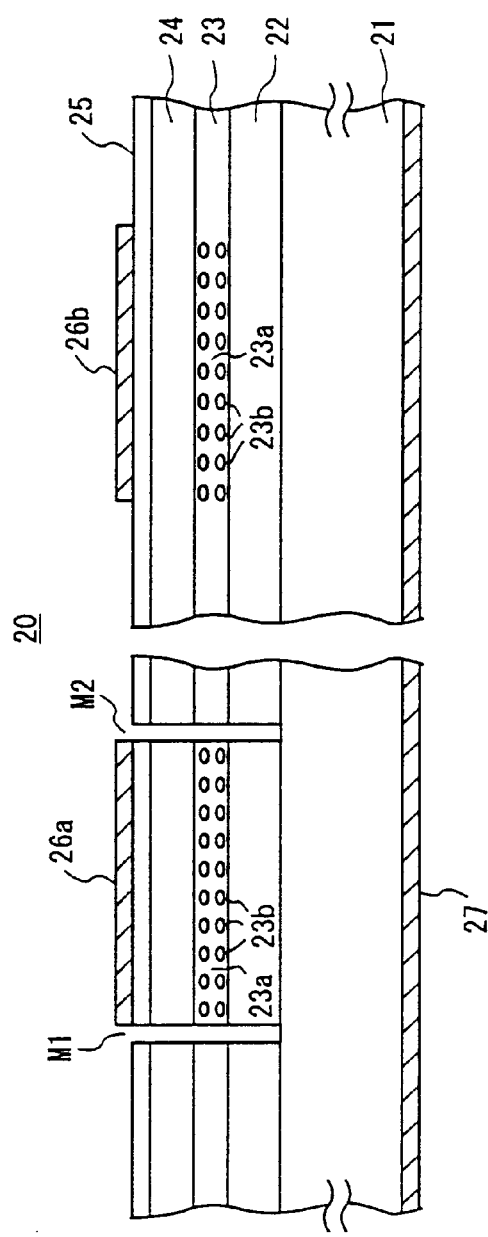
FIG. 13A
FIG. 13B

WAVELENGTH-DIVISION MULTIPLEX OPTICAL SIGNAL PROCESSOR AND A METHOD OF REGENERATING A WAVELENGTH-DIVISION MULTIPLEXED OPTICAL SIGNAL

CROSS-REFERENCE TO RELATED APPLICATION

The present application is based on Japanese priority application No.2000-067790 filed on Mar. 10, 2000, the entire contents of which are hereby incorporated by reference.

BACKGROUND OF THE INVENTION

The present invention generally relates to semiconductor devices and more particularly to an optical signal processor based on a semiconductor device having quantum dots.

In the art of long-range optical telecommunication, it is practiced to provide optical signal repeaters in an optical fiber network system with a suitable interval so as to compensate for a decay or phase-shift of optical signals transmitted through the optical fiber network over a long distance.

Thus, a repeater carries out processing of repeating the optical signals, wherein such a repeating process includes extraction of clocks from the optical signals, re-modulation of the optical signals by using the clocks thus extracted, elimination of noise from the optical signals, and the like.

FIG. 1 shows the schematic construction of an optical signal repeater 10 of a wavelength-division multiplexed optical signal according to a related art for use in a large-capacity, long-range optical telecommunication system.

Referring to FIG. 1, the optical signal repeater 10 receives an incoming wavelength-division multiplexed optical signal containing a number of channels $CH_1$–$CH_N$ having respective, mutually different wavelengths, and includes an optical demultiplexer 10A decomposes the incoming wavelength-division multiplexed optical signal into optical signal components of individual channels $CH_1$–$CH_N$. Further, the optical repeater 10 includes a plurality of repeating units $10B_1$–$10B_N$ respectively provided in correspondence to the channels $CH_1$–$CH_N$, wherein each of the repeating units $10B_1$–$10B_N$ carries out the repeating process of the optical signal component supplied thereto. Further, the optical repeater 10 includes an optical multiplexer 10C that synthesizes a wavelength-division multiplexed optical signal from the output optical signals of the repeating units $10_{B1}$–$10_{BN}$.

FIG. 2 shows the construction of an optical repeating unit, which is used for any of the optical repeating units $10B_1$–$10B_N$. As the construction of the optical repeating units $10B_1$–$10B_N$ are all identical, the following description will be given only for the optical repeating unit $10B_1$ and description of other optical repeating units will be omitted.

Referring to FIG. 2, the optical repeating unit $10B_1$ comprises a clock-extracting unit $10b_1$ for extracting an optical clock signal from the incoming optical signal component for the channel $CH_1$ and further an optical re-modulating unit $10b_2$ supplied with the optical clock signal thus extracted. Thereby, the optical re-modulating unit $10b_2$ is supplied with the incoming optical signal component directly and modulates the optical clock signal extracted by the foregoing clock-extracting unit $10b_1$ with the incoming wavelength-division multiplexed optical signal. Thus, the optical re-modulating unit $10b_2$ produces an output optical signal corresponding to the incoming optical signal component with compensation for the decay of signal waveform or phase offset and further with noise elimination.

As represented in FIG. 2, the clock-extracting unit $10b_1$ is in fact formed of a mode-locking laser diode $10c_1$ that produces an optical pulse train continuously, and the extraction of the optical clock signal is achieved by synchronizing the optical pulse trains to the clock signals in the incoming optical signal component. The optical re-modulating unit $10b_2$ comprises, on the other hand, a laser-diode amplifier $10c_2$ and carries out modulation of the optical clock signal extracted by the clock-extracting unit $10b_1$ by the incoming optical signal.

Thus, the optical repeater 10 of the related art has an advantageous feature of having a simple construction in each of the optical repeating units $10B_1$–$10B_N$ and capability of reproducing the incoming wavelength-division multiplexed optical signal directly, without converting the same once to an intermediate electrical signal and re-converting the intermediate electrical signal again to the optical signal.

On the other hand, the optical repeater 10 of the related art raises a problem, when the number of the channels has increased up to 100 or more for example, in that it requires numerous and complex optical waveguides for handling a large number of channels. Thereby, such an optical repeater 10 would require an optical phase compensator for each of the optical waveguides for compensating for any optical phase offset that may be caused as a result of the use of large number of optical waveguides of complex shape and varying lengths. Naturally, the process of adjusting these optical phase compensators for each of the optical waveguides according to the optical lengths thereof becomes an extremely tedious and complex proces, and the cost of the optical signal repeater is increased inevitably.

In the event the wavelength-division multiplexed optical signal is processed directly in the optical repeater 10 of FIGS. 1 and 2 without decomposing into individual channels, there arises a problem of cross-talk between the optical channels.

SUMMARY OF THE INVENTION

Accordingly, it is a general object of the present invention to provide a novel and useful optical processor of wavelength-division multiplexed optical signals wherein the foregoing problems are eliminated.

Another object of the present invention is to provide an optical processor of wavelength-division multiplexed optical signals wherein an incoming wavelength-division multiplexed optical signal is processed without decomposing into optical signal components of individual channels.

Another object of the present invention is to provide an optical processor of a wavelength-division multiplexed optical signal comprising:

a semiconductor substrate having a first conductivity type;

a quantum semiconductor device formed on said semiconductor substrate;

a first optical waveguide formed on said semiconductor substrate in optical coupling with said quantum semiconductor device; and a second optical waveguide formed on said semiconductor substrate in optical coupling with said quantum semiconductor device, said quantum semiconductor device comprising:

a first cladding layer of said first conductivity type formed on said semiconductor substrate;

an undoped active layer formed on said first cladding layer;

a second cladding layer of a second conductivity type formed on said undoped active layer;

a first ohmic electrode connected electrically to said semiconductor substrate; and a second ohmic electrode connected electrically to said second cladding layer, said first optical waveguide making an optical coupling with said active layer, said first optical waveguide guiding a wavelength-division multiplexed optical signal incident thereto at an input end thereof to said active layer, said second optical waveguide making an optical coupling with said active layer, said second optical waveguide guiding said wavelength-division multiplexed optical signal processed in said active layer to an output end of said second optical waveguide, said undoped active layer comprising:

an undoped compound semiconductor layer having a bandgap smaller than any of said first and second cladding layers and a plurality of mutually separated quantum dots formed inside said undoped compound semiconductor layer with a bandgap smaller than said bandgap of said undoped compound semiconductor layer.

According to the present invention, it becomes possible to carry out processing of a wavelength-division multiplexed optical signal directly, without decomposing the same into optical signal components of individual channels, by using a non-linear optical semiconductor device that uses self-organized quantum dots appearing in a strained heteroepitaxial system.

Other objects and further features of the present invention will become apparent from the following detailed description when read in conjunction with the attached drawings.

BRIEF DESCRIPTION OF THE DRAWINGS

FIGS. 13A and 13B are diagrams showing the construction of the wavelength-division multiplexed optical repeater of FIG. 9 respectively in a plan view and in a cross-sectional view;

DETAILED DESCRIPTION OF THE INVENTION

[Principle]

Figure 1:
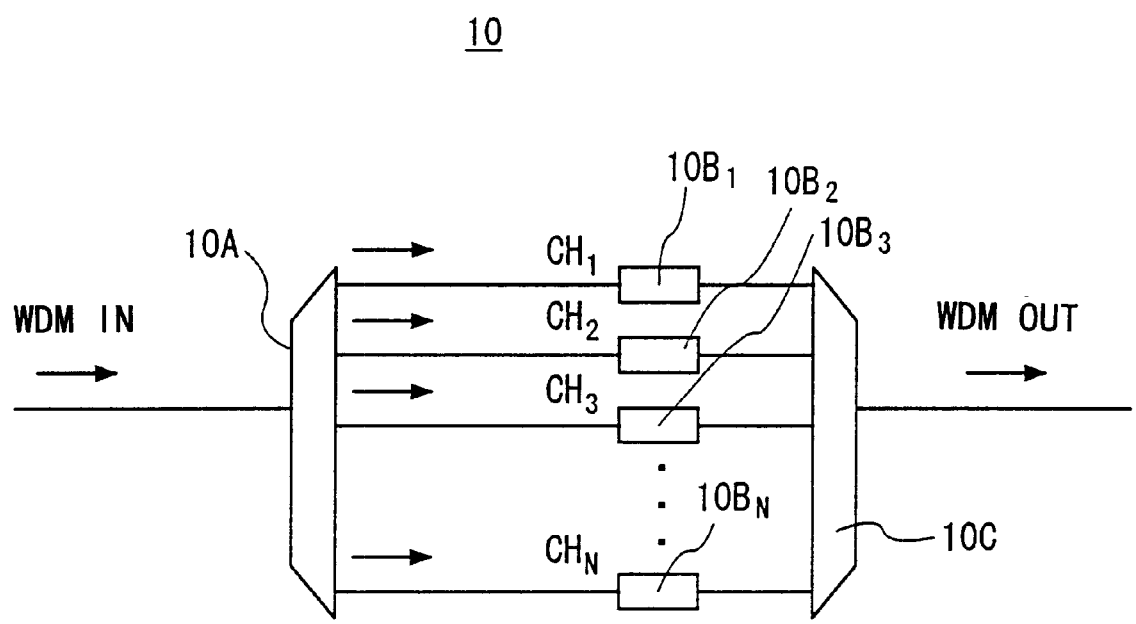
FIG. 1 is a diagram showing the construction of a conventional wavelength-division multiplexed optical signal repeater.
Figure 2:
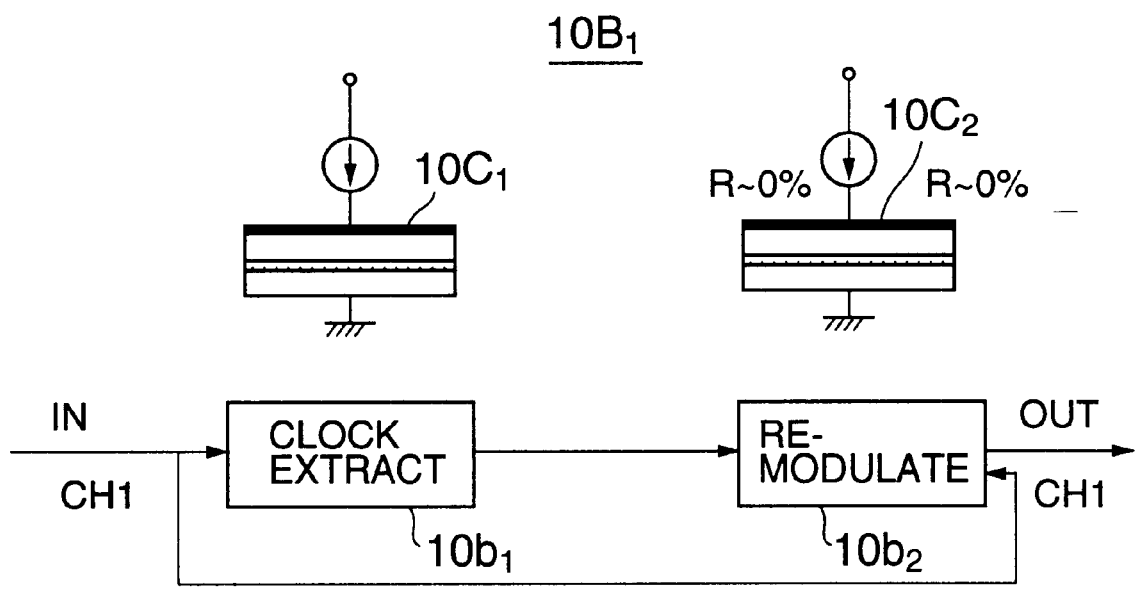
FIG. 2 is a diagram showing a part of the optical signal repeater of FIG. 1 for processing a single channel optical signal component.

In the investigation that constitutes the basis of the present invention, the inventor of the present invention has studied the cause of the cross-talk, which arises in the wavelength-division multiplexed optical signal repeater 10 of the related art of FIGS. 1 and 2 when a wavelength-division multiplexed optical signal is directly processed therein and made the following discovery.

In the optical signal repeater 10 of the related art explained with reference to FIGS. 1 and 2, both of the laser diode $10c_1$ and the laser-diode amplifier $10c_2$ use an active layer having an ordinary quantum well structure in which a thin quantum well layer is sandwiched vertically by a pair of barrier layers.

Figure 3:
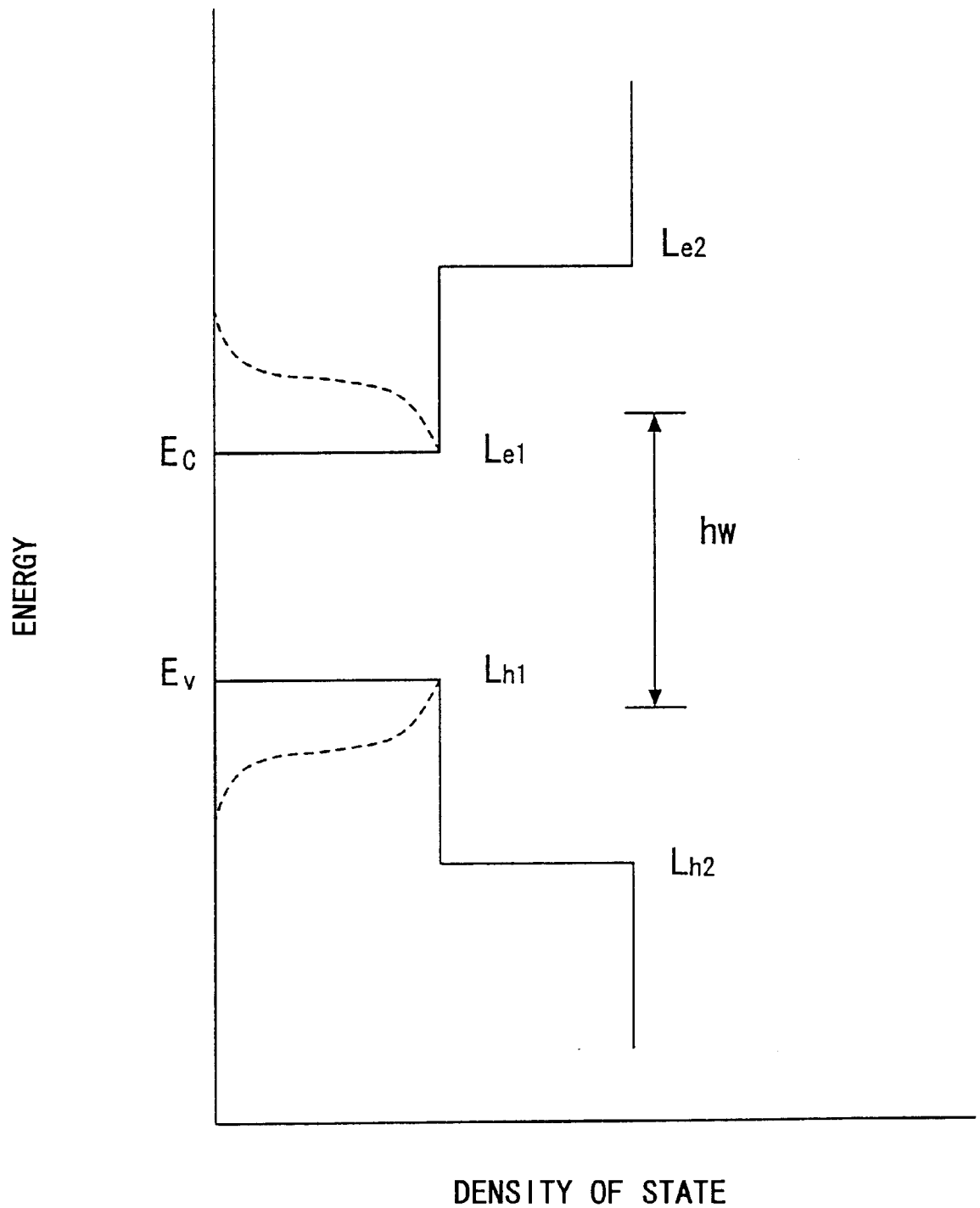
FIG. 3 is a diagram showing a density of state of an ordinary quantum well.

FIG. 3 shows the density of state of such an ordinary quantum-well active layer.

Referring to FIG. 3, it is well know in the art that the density of state of such an ordinary quantum well increases stepwise with energy at the quantum levels $Le_1$, $Le_2$, . . . formed in the conduction band Ec or in correspondence to the quantum levels $Lh_1$, $Lh_2$, . . . formed in the valence band Ev, and that the carriers are distributed according to Fermi-Dirac statistics in each of the steps.

In the event there comes in an incident optical beam with the energy of $h\omega$, the electrons on the valence band are excited to the conduction band and there occurs a saturation of absorption. As a result of the absorption saturation, there appears a temporary dip in the absorption spectrum as represented in FIG. 4.

Figure 4:
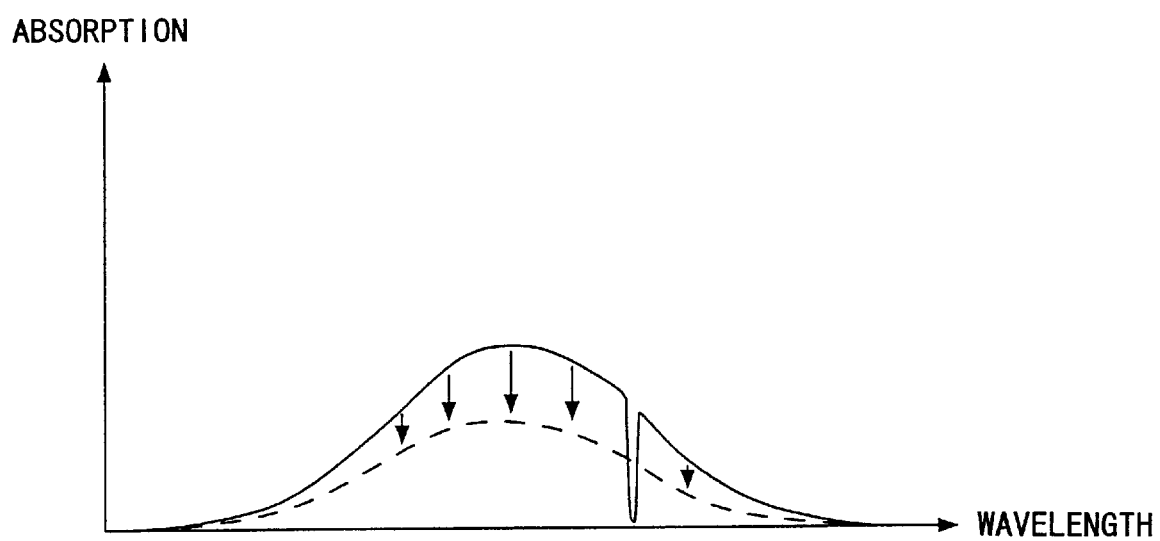
FIG. 4 is a diagram showing the optical absorption characteristic of an ordinary quantum well structure.

The dip thus formed, however, disappears immediately by a relaxation process taking place as a result of carrier-carrier scattering occurring in the quantum well layer, and the initial thermal equilibrium state, and hence the initial absorption spectrum, is restored immediately as represented in FIG. 4 by a broken line. It should be noted that the optical absorption spectrum thus restored no longer contains the dip. Such a recovery takes place in any wavelengths.

Thus, the inventor of the present invention has noticed that it is this relaxation process which is the cause of the cross-talk occurring in the optical signal repeater 10 of the related art that uses an ordinary quantum well for the active layer of the laser diode $10c_1$ or for the active layer of the laser-diode amplifier $10c_2$. Because of this relaxation process, it has been necessary in the optical repeater 10 of the related art to provide the laser diode $10c_1$ and the laser-diode amplifier $10c_2$ for each of the separated channels $CH_1$–$CH_N$.

Figure 5:
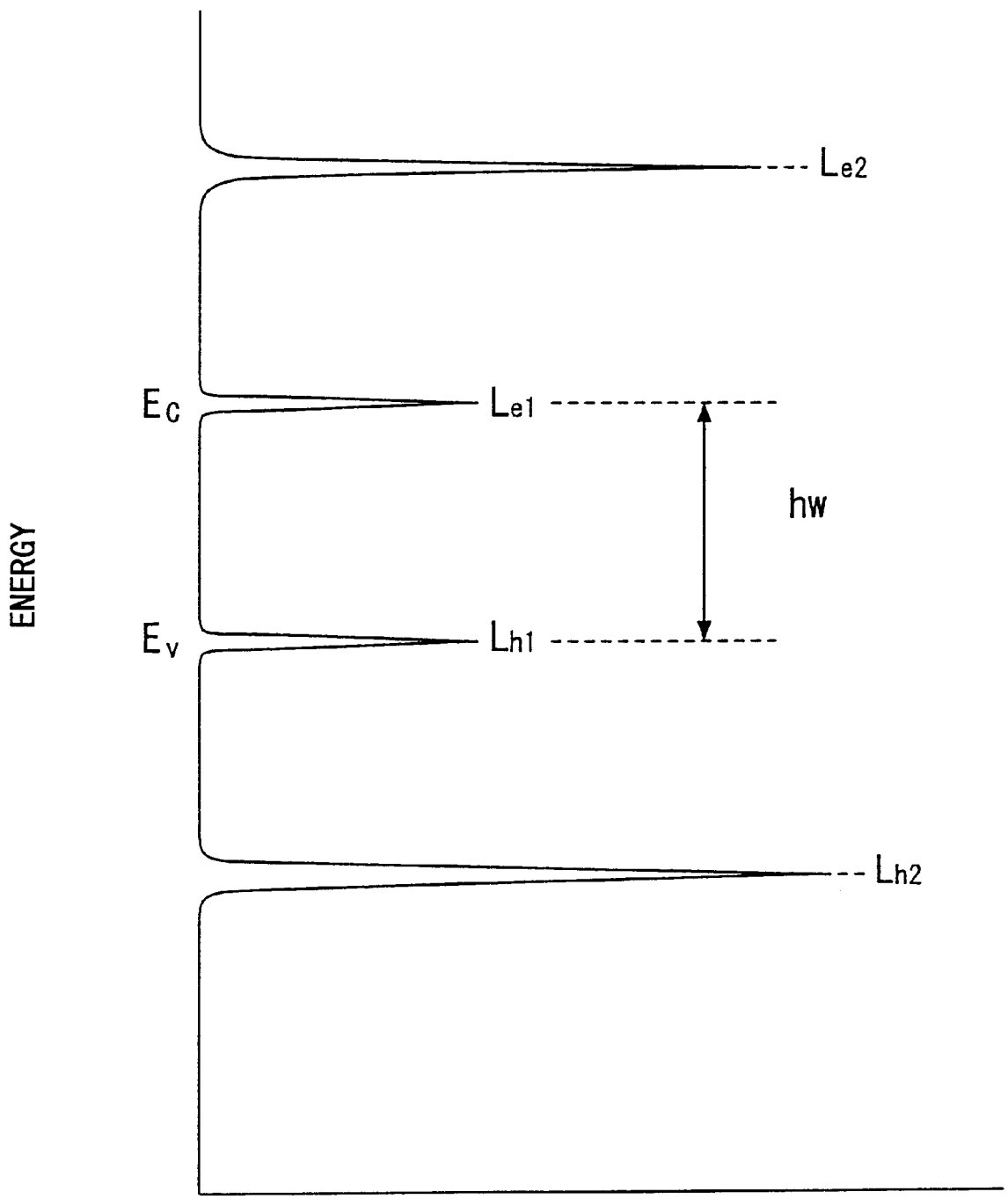
FIG. 5 is a diagram showing a density of state of a quantum dot.

FIG. 5, on the other hand, shows the density of state for a quantum dot in which the carriers are confined three dimensionally in a narrow space.

Referring to FIG. 5, the density of state takes a form like a δ-function and that there appears a discrete distribution of the quantum levels $Le_1$, $Le_2$, . . . or $Lh_1$, $Lh_2$, . . . .

In the case there comes in an optical signal having the optical energy hω to an active layer containing such quantum dots, it should be noted that there occurs an absorption saturation only at the wavelength corresponding to the optical energy hω, not in other wavelengths. This means that it is possible to carry out the repeating of the incoming optical signal, without causing the problem of cross-talk with other optical signals of other channels, and without decomposing the incoming wavelength-division multiplexed optical signal into individual optical signal components.

As can be seen from FIG. 5, a single quantum dot has a corresponding energy hω corresponding to a single optical wavelength. Thus, in order to process a wavelength-division multiplexed optical signal, it is necessary to provide a number of quantum dots tuned to different optical wavelengths in the active layer of the laser diode or laser-diode amplifier constituting the optical repeater.

Figure 6:
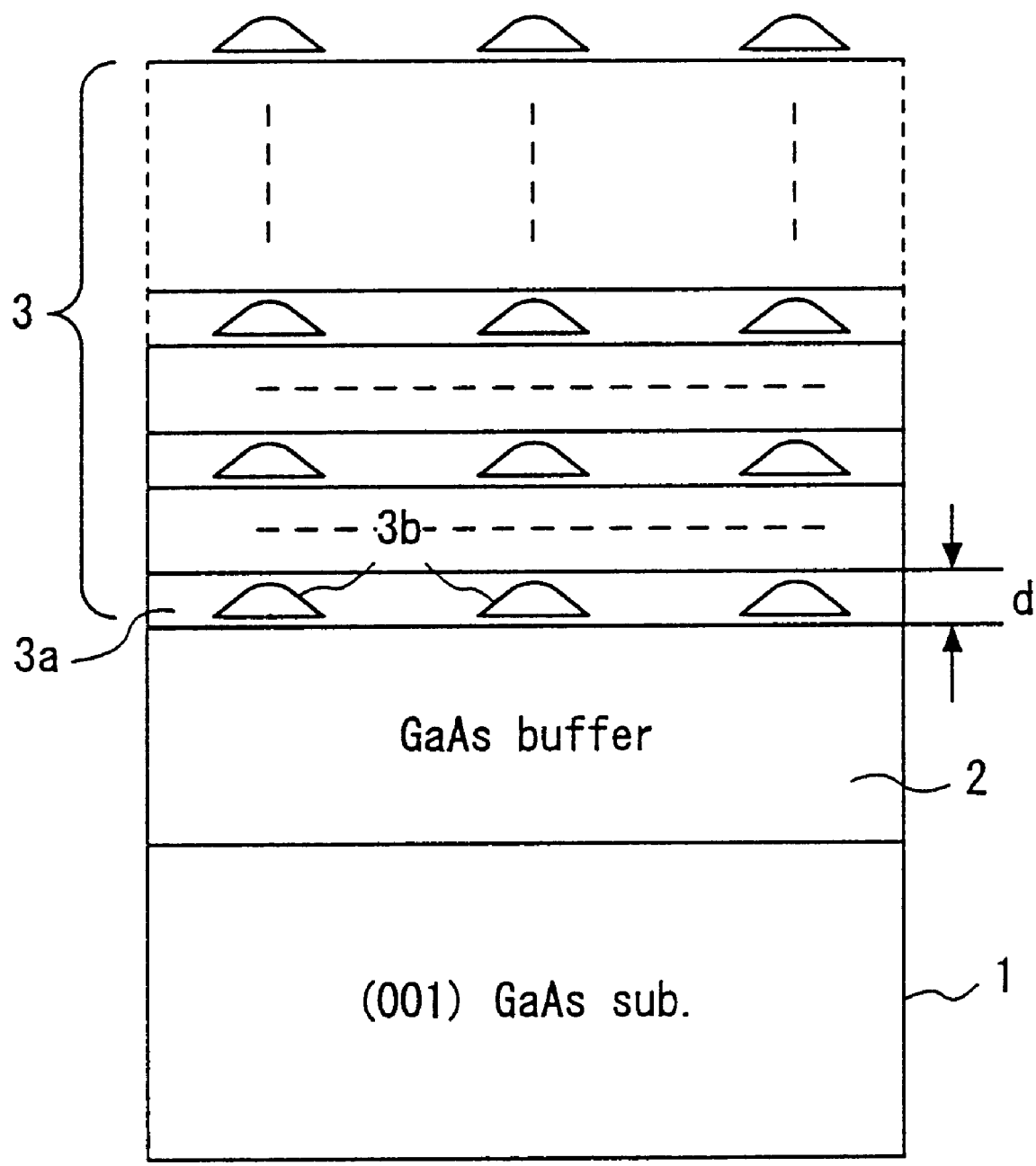
FIG. 6 is a diagram showing the principle of the present invention.

In order to cover the wavelength band of the wavelength-division multiplexed optical signals, the present invention uses self-organized quantum dots that are formed in a strained heteroepitaxial system as represented in FIG. 6. It should be noted that such self-organized quantum dots are formed by a Stranski-Krastanow mode growth at a heteroepitaxial interface without external or intentional control of the size thereof. Thus, the quantum dots of FIG. 6 collectively provide a continuous absorption spectrum spread broadly as represented FIG. 7, wherein the spreading of the absorption spectrum arises as a result of natural size distribution of the quantum dots.

Referring to FIG. 6, a GaAs substrate 1 is covered with a GaAs buffer layer 2, and a layer of a III–V compound semiconductor material having a lattice-misfit composition such as InAs is formed on the GaAs buffer layer 2 epitaxially by an MOVPE process or an MBE process. In such a strained heteroepitaxial system, the InAs layer thus deposited form an island structure due to the large strain energy, and there are formed a number of InAs droplets 3b each having a diameter of several nanometers to several tens of nanometers and a height of several nanometers.

Thus, by providing an intermediate layer 3a of GaAs on the buffer layer 2 so as to cover the InAs droplets 3b thereon and further by repeating the process of forming the InAs droplets 3b and the intermediate layer 3a a plurality of times, there is formed a quantum dot structure 3 in which the InAs droplets 3b are scattered in the GaAs intermediate layers 3a. In the structure 3, it should be noted that each of the InAs droplets 3b are three-dimensionally confined by the GaAs intermediate layer 3a and form a quantum dot characterized by the density of state represented in FIG. 5.

Figure 7:
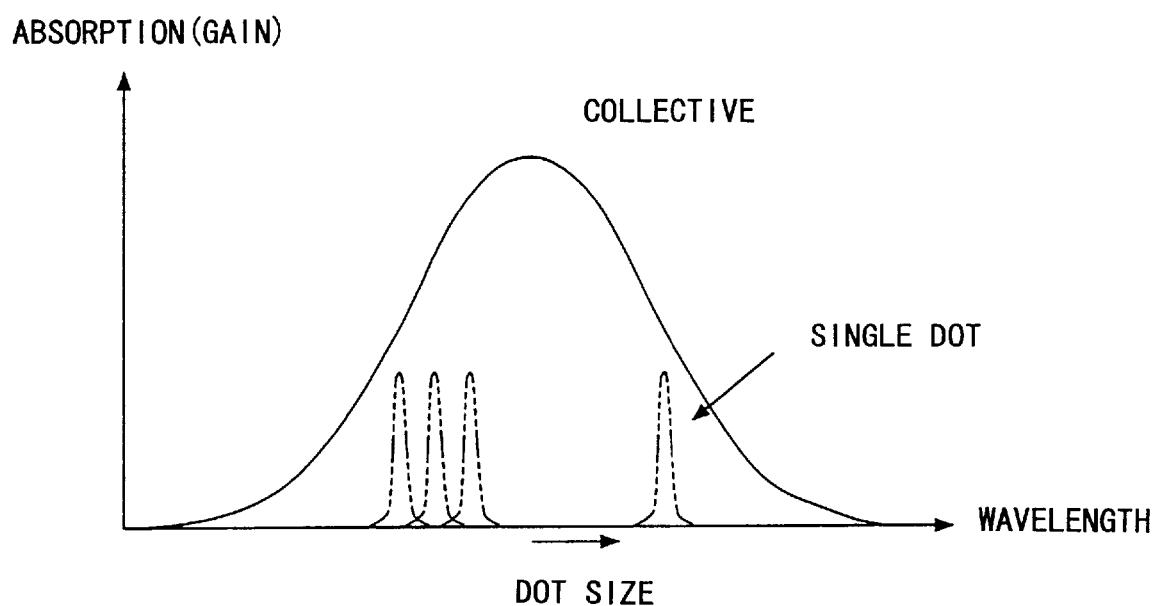
FIG. 7 is a diagram showing an overall optical absorption spectrum of the quantum dot structure of FIG. 6.

FIG. 7 shows the overall optical absorption spectrum of the InAs/GaAs quantum dot structure 3 of FIG. 6 schematically.

Referring to FIG. 7, it can be seen that, while each of the quantum dots 3b has a sharp absorption spectrum, the quantum dots 3b collectively form a continuous absorption spectrum spread broadly over a wide wavelength range.

Figure 8:
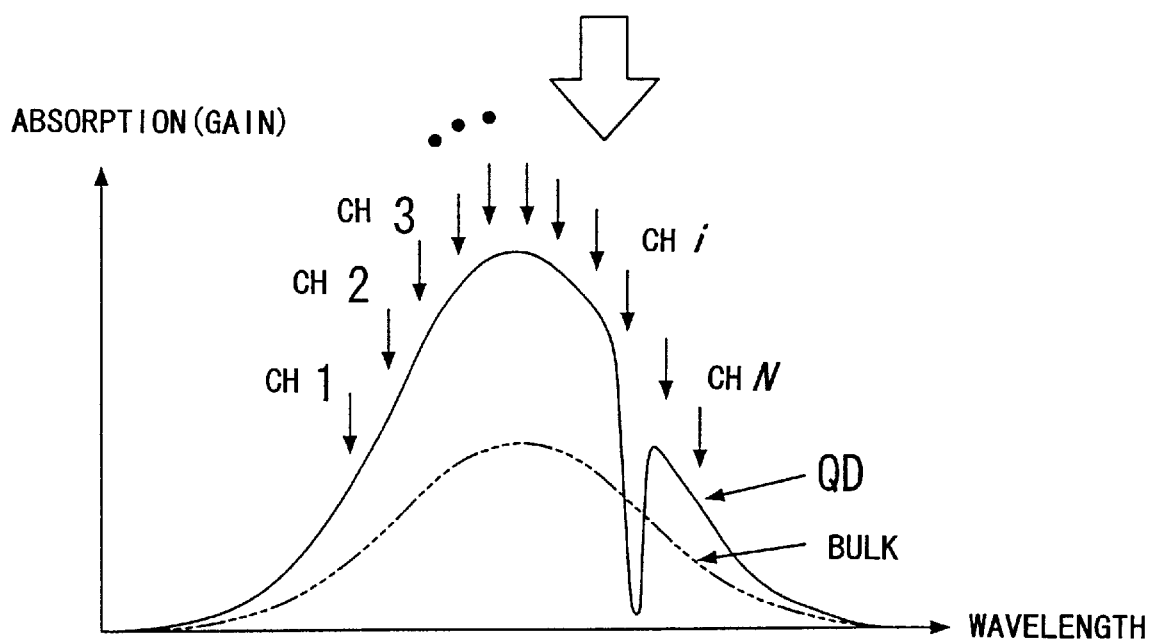
FIG. 8 is a diagram showing the change of the optical absorption spectrum in the case of incoming of an incident optical signal of a channel j.

When there comes in an optical signal component corresponding to a channel $CH_j$ to such an InAs/GaAs quantum dot structure 3, there occurs a selective absorption saturation in those quantum dots having the energy corresponding to the channel $CH_j$, and there appears a sharp dip in the absorption spectrum as indicated in FIG. 8 by a continuous line. Because of the increased relaxation time in such a quantum dot structure 3, in which the quantum dots are spatially isolated from each other, the absorption spectrum is maintained stably even when such a dip is formed therein.

Summarizing above, it becomes possible to induce the optical absorption for each of the optical signal components independently, by employing the quantum dot structure 3 in which the quantum dots are formed as a result of strained heteroepitaxial growth. By using the quantum dot structure 3 in the optical repeating unit $10B_1$ of FIG. 2 for the active layer of the laser diode $10c_1$ or the active layer of the laser-diode amplifier $10c_2$, it becomes possible to carry out the repeating of the wavelength-division multiplexed optical signal directly, without decomposing or demultiplexing into individual optical signal components.

[First Embodiment]

Figure 9:
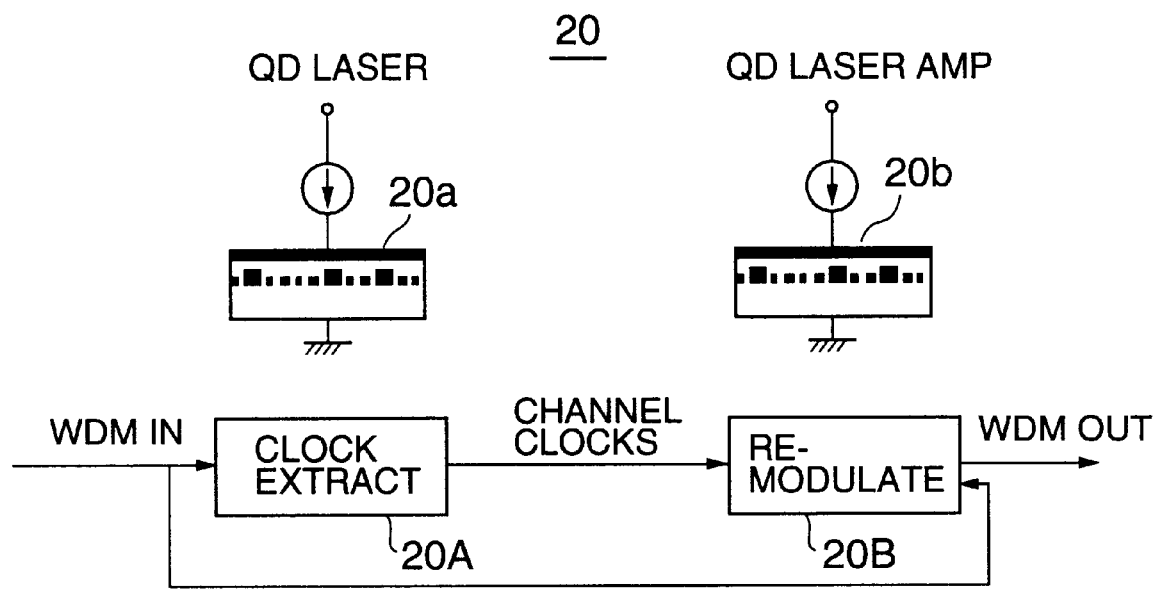
FIG. 9 is a diagram showing the construction of a wavelength-division multiplexed optical signal repeater according to a first embodiment of the present invention.

FIG. 9 shows the construction of a wavelength-division multiplexed optical signal repeater 20 according to a first embodiment of the present invention.

Referring to FIG. 9, the optical signal repeater 20 comprises a clock-extracting unit 20A supplied with the incoming wavelength-division multiplexed optical signal directly for extracting optical clock signals therefrom and a re-modulating unit 20B for modulating the optical clock signal thus extracted with the incoming wavelength-division multiplexed optical signal, wherein the clock-extracting unit 20A uses a laser diode 20a having the self-organized quantum dots explained with reference to FIG. 6 in the active layer thereof, while the re-modulating unit 20B uses a laser-diode amplifier 20b also having the self-organized quantum dots in the active layer thereof.

Figure 10A:
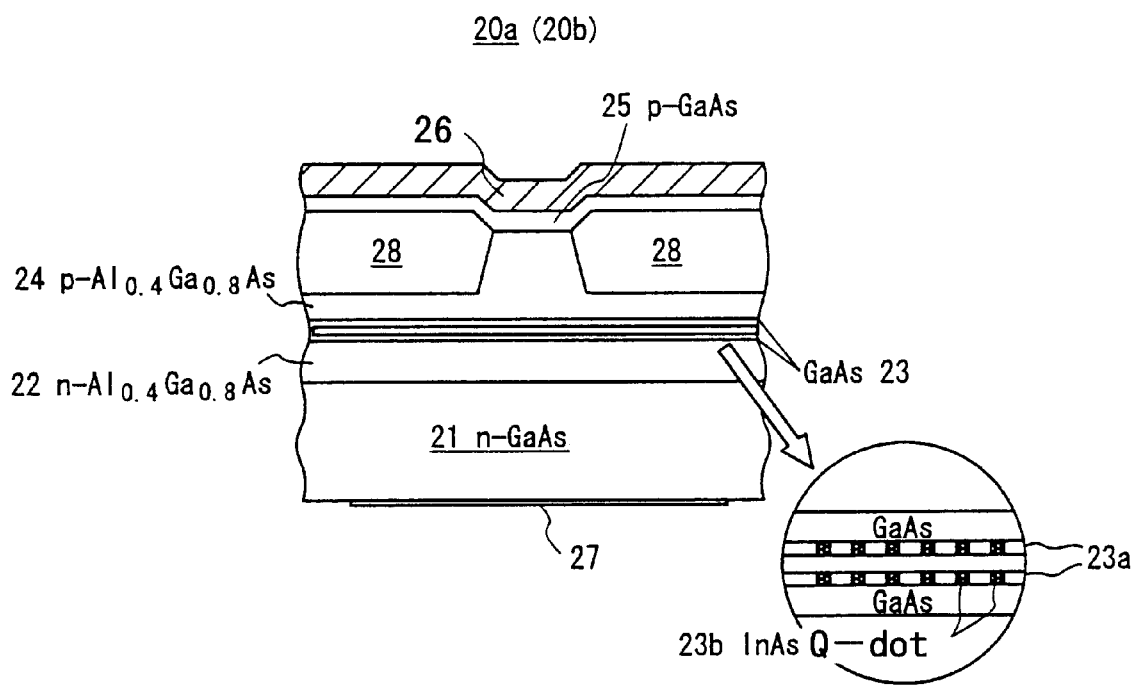
FIGS. 10A and 10B are diagrams showing the construction of a laser diode that is used in the optical signal repeater of FIG. 9.
Figure 10B:
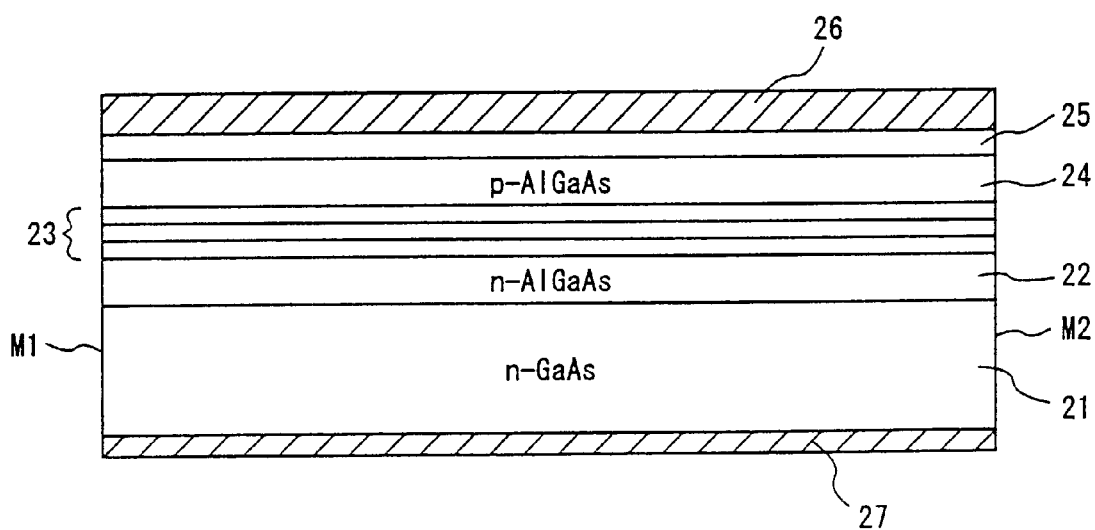

FIGS. 10A and 10B show the construction of the laser diode 20a of FIG. 9 respectively in a transversal cross-sectional view and in an elevational cross-sectional view.

Referring to FIGS. 10A and 10B, the laser diode 20a is constructed on a substrate 21 of n-type GaAs and includes a cladding layer 22 of n-type AlGaAs formed epitaxially on the substrate 21 with a composition represented as $Al_{0.4}Ga_{0.6}As$, an active layer 23 formed epitaxially on the cladding layer 22, and another cladding layer of p-type AlGaAs formed epitaxially on the active layer 22 with a composition substantially identical with the composition of the cladding layer 22. The cladding layer 24 includes a mesa-ridge structure extending in the axial direction of the laser diode 20a, and the mesa-ridge structure carries a p-type ohmic electrode via an intervening contact layer 25 of $p^+$-type GaAs. Further, an n-type ohmic electrode 27 is formed on the bottom surface of the substrate 21.

In the structure of FIG. 10A, current-confinement regions 28A and 28B of n-type GaAs are formed at both lateral sides of the mesa-ridge structure.

As represented in FIG. 10B, the laser diode 20a includes therein an optical cavity defined by mirror surfaces $M_1$ and $M_2$ such that the optical cavity extends in the axial direction of the laser diode with a cavity length of about 900 μm. The mesa-ridge structure may have a lateral width of about 3 μm.

As explained before with reference to FIG. 6, the active layer 23 of the laser diode 20a includes a stacking of a number of epitaxial layers 23a of undoped GaAs, wherein each of the epitaxial layers 23a carries thereon a number of self-organized quantum dots 23b of undoped InAs. See the enlarged view in FIG. 10A. As noted previously, InAs forms a strained heteroepitaxial system with respect to the GaAs substrate. The laser-diode amplifier 20b also has substantially identical construction.

Figure 11A:
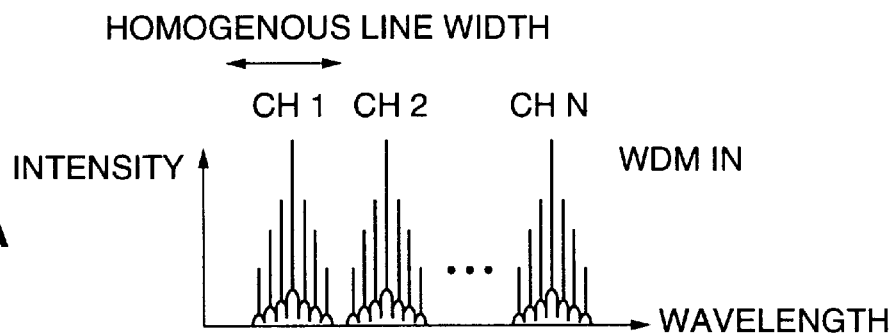
FIGS. 11A–11C are diagrams showing the spectrum of the wavelength-division multiplexed optical signal applied with the optical processing in the optical repeater of FIG. 9.
Figure 11B:
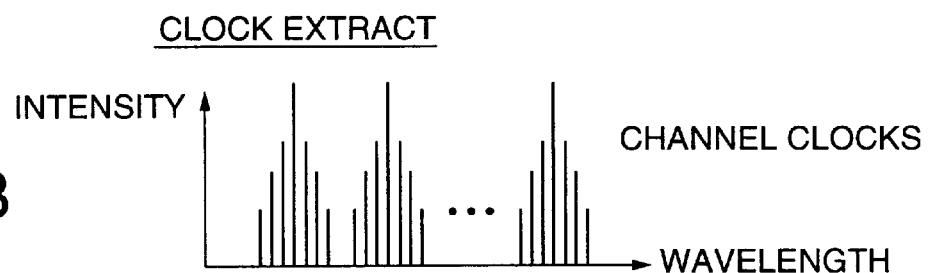

In the clock-extracting unit 20A, the laser diode 20a of FIGS. 10A and 10B is driven as a mode-locking laser, and multi-channel clock signals, of which spectra are represented schematically in FIG. 11B, are extracted from a multi-channel wavelength-division multiplexed optical signal of FIG. 11A showing the spectrum thereof.

Figure 11C:
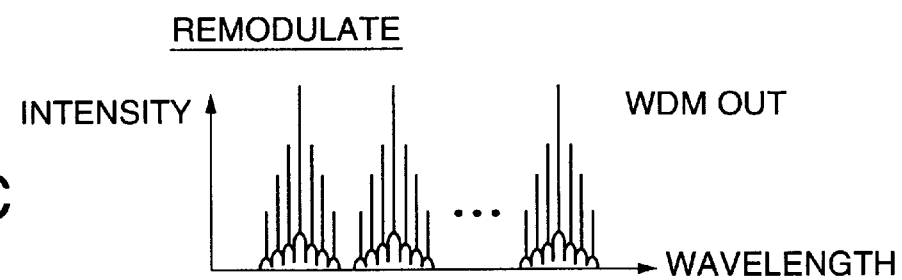

In the re-modulating unit 20B, it should be noted that the laser diode of FIGS. 10A and 10B are driven as a laser-diode amplifier, and the multi-channel optical clock signals of FIG. 11B are modulated by the optical input signal of FIG. 11A. As a result of the modulation, a reproduced wavelength-division multiplexed optical signal is obtained as represented in FIG. 11C. Similarly as before, FIG. 11C represents the spectrum of the reproduced wavelength-division multiplexed optical signal.

Figure 12:
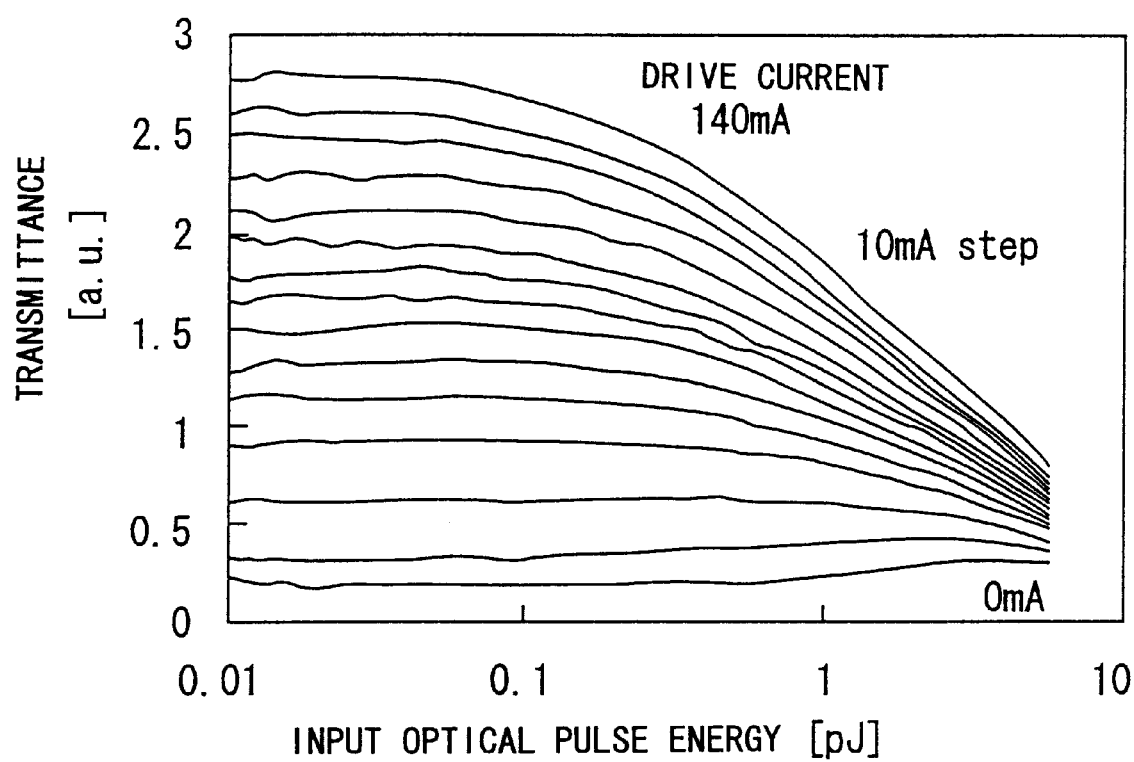
FIG. 12 is a diagram showing the relationship between a transmittance and input optical power of the laser diode of FIGS. 10A and 10B.

FIG. 12 shows the gain of the re-modulating unit 20B for the case the-laser diode of FIGS. 10A and 10B is used for the laser-diode amplifier 20b of the re-modulating unit 20B for various driving conditions, wherein FIG. 12 is for the case an optical pulse having a wavelength of 1150 nm and a pulse width of 970 fs is amplified.

Referring to FIG. 12, it can be seen that a very low transmittance is obtained when the magnitude of the drive currents injected via the ohmic electrodes 26 and 27 is set to 0 mA, and there occurs an optical absorption in the active layer 23. When the optical power of the incoming optical signal is increased beyond about 1 pJ in this state, on the other hand, it can be seen that there occurs an increase of the transmittance, indicating the occurrence of the saturation of optical absorption.

When the magnitude of the drive current is set to 140 mA, on the other hand, the laser-diode amplifier 20b shows a large transmittance in the case there is no incoming optical signal, and a large gain of about 10 dB is obtained for a feeble optical signal of about 0.1 pJ. When the optical power of the incoming optical signal is increased beyond 0.1 pJ, on the other hand, the transmittance of the laser-diode amplifier 20b drops sharply, indicating the occurrence of gain saturation. In the case the incident optical signal has an optical power of 5 pJ, it can be seen that the gain reduced to 5.3 dB.

As explained with reference to FIGS. 7 and 8, the absorption saturation or gain saturation noted in FIG. 12 occurs substantially independently for each of the optical signal components when the active layer 23 of the laser-diode amplifier 20b of FIGS. 10A and 10B includes the self-organized quantum dots 23b of mutually different sizes. Thus, by supplying the wavelength-division multiplexed optical signal of FIG. 11A to the laser-diode amplifier 20b in addition to the extracted multi-channel optical clock signals of FIG. 11B, it becomes possible to modulate the optical clocks by the optical signal components of the wavelength-division multiplexed optical signal according to the optical channels, and it becomes possible to reproduce the optical signal components.

It should be noted that the saturation characteristic of FIG. 12, obtained for the wavelength of 1150 nm, is valid also for any arbitrary wavelength in the range of 1130–1170 nm. This validity is confirmed in the experiments conducted with the interval of 5 nm in the foregoing wavelength range.

FIGS. 13A and 13B respectively show the construction of the optical signal repeater 20 of FIG. 9 in a plan view and in a cross-sectional view taken along a line A–A' of FIG. 13A.

Referring to FIG. 13A, the optical signal repeater 20 is constructed on the n-type GaAs substrate 21 and includes optical waveguide patterns 20₁, 20₂ and 20₃ each having a layered cross-sectional structure represented in FIG. 13B, wherein the wavelength-division multiplexed optical signal of FIG. 11A is supplied to the foregoing optical waveguide pattern 20₁ and is guided through the optical waveguide patterns 20₂. The wavelength-division multiplexed optical signal thereby experiences clock extraction and re-modulation as it is guided through the optical waveguide pattern 20₂ in which the clock-extracting unit 20a and the re-modulating unit 20b are formed, as a result of the action of the InAs quantum dots 23b formed in the clock-extracting unit 20a and the re-modulating unit 20b.

The resultant wavelength-division multiplexed optical signal thus reproduced is then guided through the optical waveguide pattern 20₃ to an output end thereof.

In the optical waveguide pattern 20₂, it should be noted that a p-type ohmic electrode 26a is provided in correspondence to the clock-extracting unit 20a similarly to the p-type ohmic electrode 26. Further, a p-type ohmic electrode 25b is provided on the waveguide pattern 20₂ in correspondence to the re-modulating unit 20b. Further, the bottom surface of the GaAs substrate 21 is covered by the n-type ohmic electrode 27 uniformly. In the optical waveguide pattern 202, it should further be noted that there are formed grooves as the mirror surfaces $M_1$ and $M_2$. As noted previously, the mirror surfaces $M_1$ and $M_2$ form the optical cavity of the laser diode.

As can be seen in FIG. 13A, there is formed another optical waveguide pattern 20₄ so as to branch from the optical waveguide pattern 20₁, wherein the optical waveguide pattern 20₄ injects the wavelength-division multiplexed optical signal entered into the optical waveguide pattern 201 to the laser-diode amplifier 20b constitutes the re-modulating unit 20B.

Thus, the optical signal repeater 20 of FIGS. 13A and 13B, formed integrally on the common GaAs substrate 21, reproduces the incoming wavelength-division multiplexed optical signal without decomposing into individual optical signal components, and the construction of the optical signal repeater is simplified substantially as compared with the optical signal repeater 10 represented in FIG. 1 or 2.

[Second Embodiment]

Figure 14A:
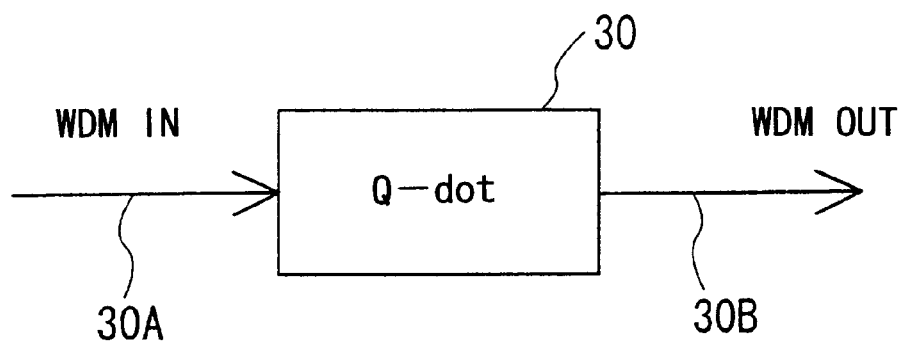
FIGS. 14A and 14B are diagrams showing the construction of an optical noise-cut filter according to a second embodiment of the present invention.
Figure 14B:
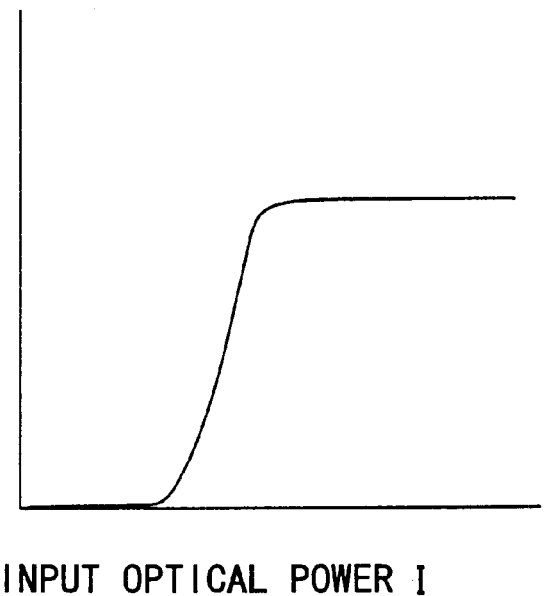

FIG. 14A shows the construction of a noise-cut filter 30 according to a second embodiment of the present invention that uses the self-organized quantum dots, while FIG. 14B represents the transmittance T of the noise-cut filter 30 of FIG. 14A.

Referring to FIG. 14A, the noise-cut filter 30 has a construction similar to that of the laser diode 20a explained with reference to FIGS. 10A and 10B and receives a wavelength-division multiplexed optical signal at the active layer 23 via an input-side optical waveguide 30A, wherein the wavelength-division multiplexed optical signal is supplied to an output-side optical waveguide 30B after being processed in the active layer 23.

in operation, the noise-cut filter 30 is driven with a zero or very small drive current and there occurs an absorption saturation in the noise-cut filter 30 as explained already with reference to FIG. 12.

FIG. 14B shows the transmittance of the noise-cut filter 30 under the condition of such a low-drive current, wherein it should be noted that the horizontal axis of FIG. 14B represents the range of the incident optical power substantially larger than the range represented in FIG. 12.

Referring to FIG. 14B, the noise contained in the incident wavelength-division multiplexed optical signal with small optical power is suppressed by the noise-cut filter 30 and cannot reach the output-side optical waveguide 30B. Thus, the optical noise-cut filter 30 allows passage of optical signal only when the optical signal comes in with a sufficiently large optical power.

[Third Embodiment]

Figure 15:
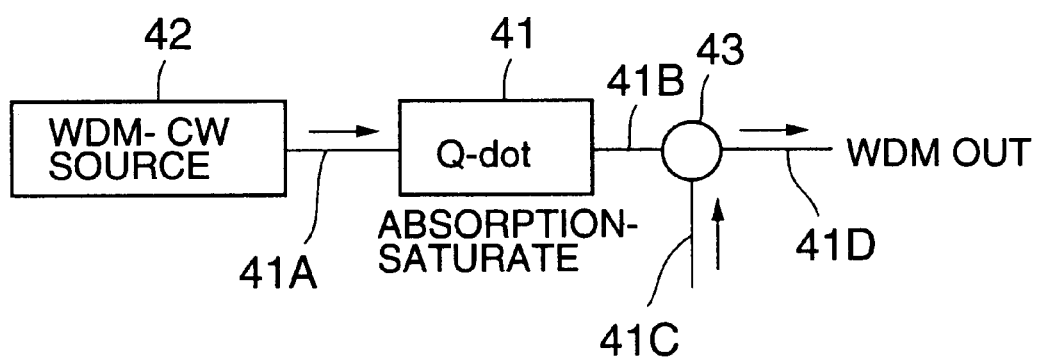
FIG. 15 is a diagram showing the construction of a wavelength-division multiplexed optical repeater according to a third embodiment of the present invention.

FIG. 15 shows the construction of a wavelength-division multiplexed optical signal repeater 40 according to a third embodiment of the present invention.

Referring to FIG. 15, the optical signal repeater 40 of the present embodiment includes an absorption-saturation semiconductor device 41 identical in construction with the device explained previously with reference to FIGS. 10A and 10B, wherein the absorption-saturation device 41 is irradiated with optical radiation produced by a multiple-wavelength continuous-wave (CW) optical source 42 that produces a continuous optical wave at each of the wavelengths constituting the channels $CH_1$–$CH_N$ of a wavelength-division multiplexed optical signal to be processed, via a first optical waveguide 41A. Further, a wavelength-division multiplexed optical signal incident to an optical waveguide 41C is supplied to the foregoing absorption-saturation device 41 from an optical circulator 43 via another optical waveguide 41B.

Thereby, the absorption-saturation device 41 is driven under a zero-bias condition or a low-bias condition and the multiple-wavelength continuous optical wave produced by the optical source 42 is modulated by the incident wavelength-division multiplexed optical signal. An reproduced wavelength-division multiplexed optical signal thus produced is then transmitted through the optical waveguide 41B in the reverse direction and is supplied to an output optical waveguide 41D after passing through the optical circulator 43.

In the present embodiment, too, it is possible to carry out repeating of the optical signal components in the channels $CH_1$–$CH_N$ of the incoming wavelength-division multiplexed optical signal without demultiplexing the wavelength-division multiplexed optical signal into individual optical signal components, by using the semiconductor device 41 that includes the self-organized quantum dots.

[Fourth Embodiment]

Figure 16:
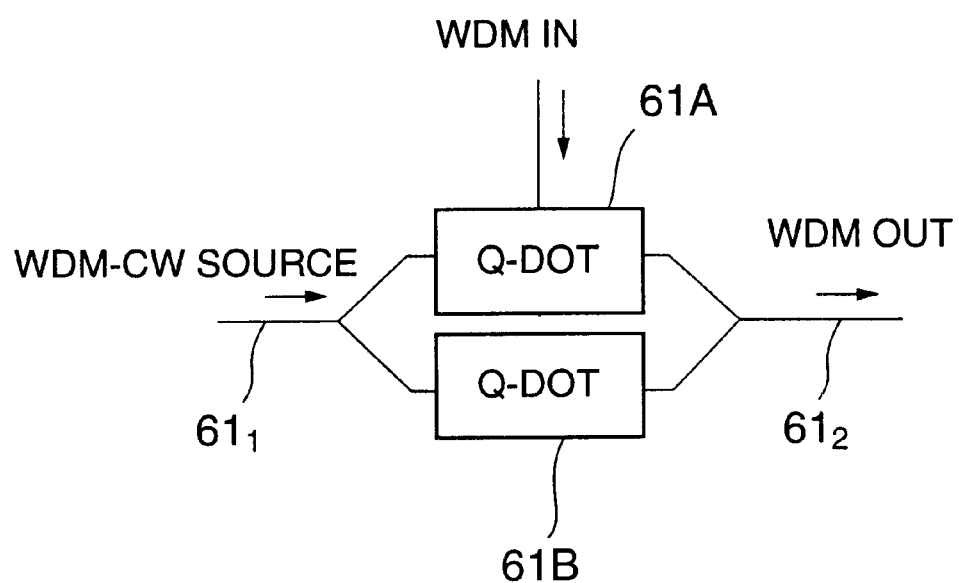
FIG. 16 is a diagram showing the construction of a wavelength-division multiplexed optical repeater according to a fourth embodiment of the present invention.

FIG. 16 shows the construction of a wavelength-division multiplexed optical signal repeater 60 according to a fourth embodiment of the present invention.

Referring to FIG. 16, the optical signal repeater 60 includes first and second non-linear optical devices 61A and 61B supplied commonly with the multiple-wavelength continuous optical wave from a multiple-wavelength continuous-wave optical source 42 similarly to the multiple-wavelength continuous-wave optical source 42 of FIG. 15 via an optical waveguide $61_1$, wherein each of the non-linear optical devices 61A and 61B contains a number of self-organized quantum dots in the active layer as represented in FIGS. 10A and 10B. Thereby, the non-linear optical device 61A is further supplied with an incoming wavelength-division multiplexed optical signal and there occurs a phase modulation of the multiple-wavelength continuous-wave optical wave in the non-linear optical device 61A, while there occurs no such a phase modulation in the non-linear optical device 61B. By synthesizing the output optical signals of the non-linear optical devices 61A and 61B at an output optical waveguide $61_2$, a modulated optical signal alone is obtained in the output optical waveguide $61_2$ as the reproduced wavelength-division multiplexed optical signal.

[Fifth Embodiment]

Figure 17:
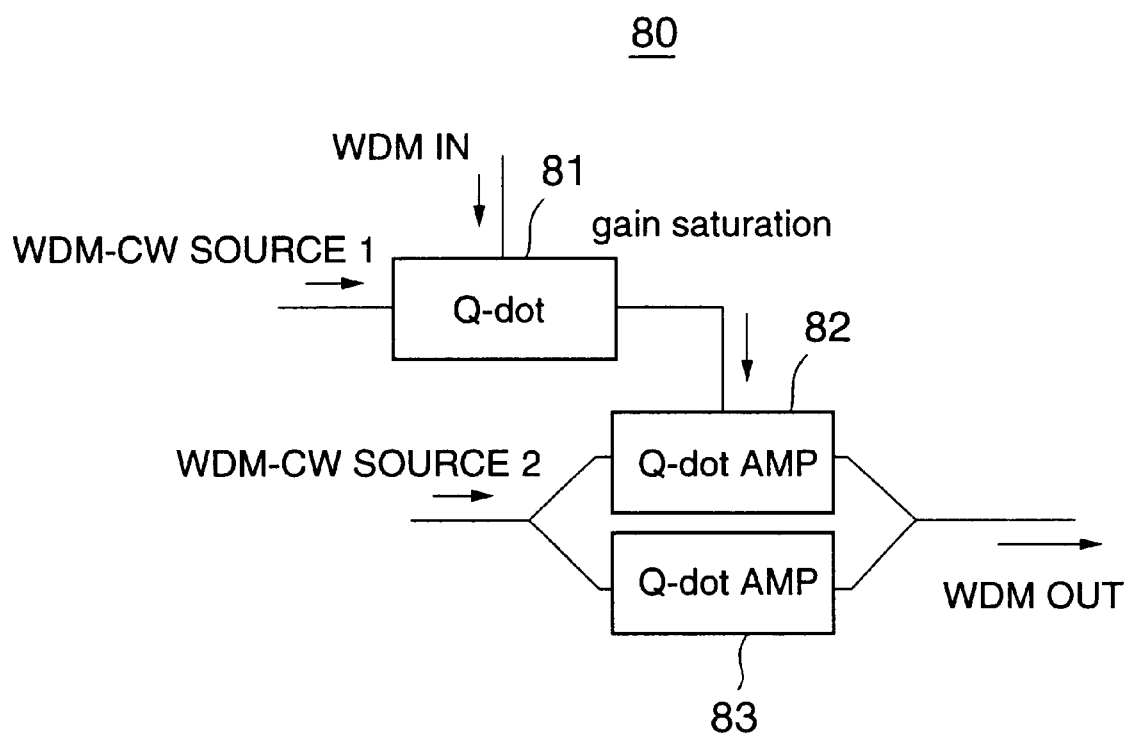
FIG. 17 is a diagram showing the construction of a wavelength-division multiplexed optical repeater according to a fifth embodiment of the present invention.

FIG. 17 shows the construction of a wavelength-multiplex optical signal repeater 80 according to a fifth embodiment of the present invention.

Referring to FIG. 17, the optical signal repeater 80 includes a quantum-dot laser-diode amplifier 81 having a construction similar to that explained with reference to FIGS. 10A and 10B, wherein the laser-diode amplifier 81 is supplied with a multiple-wavelength continuous optical wave from an optical source WDM-CW SOURCE 1 similar to that of the optical source 42 and further with an incoming wavelength-division multiplexed optical signal and produces a wavelength-division multiplexed optical signal corresponding to the incoming wavelength-division multiplexed optical signal as a result of modulation of the multiple-wavelength continuous optical wave by the incoming wavelength-division multiplexed optical signal.

In the construction of FIG. 17, the wavelength-division multiplexed optical signal thus produced by the quantum-dot laser-diode amplifier 81 is then supplied to another quantum-dot laser-diode amplifier 82 which receives another multiple-wavelength continuous optical wave from another optical source WDM-CW SOURCE 2, and there occurs in the laser-diode amplifier 82 a phase modulation of the multiple-wavelength optical signal by the output optical signal of the laser-diode amplifier 81.

The multiple-wavelength continuous optical wave of the optical source WDM-CW SOURCE 2 supplied to the laser-diode amplifier 82 is further supplied to another quantum-dot laser-diode amplifier 83, and a reproduced wavelength-division multiplexed optical signal is obtained by synthesizing the output optical signal of the laser-diode amplifier 82 and the output optical signal of the laser-diode amplifier 83.

In the present embodiment, it is possible to use the quantum-dot laser-diode amplifier of FIGS. 10A and 10B for each of the laser-diode amplifiers 81–83.

In the construction of FIGS. 10A and 10B, it should be noted that the active layer 23 is by no means limited to the InAs/GaAs heteroepitaxial structure but other combination of materials listed below may also be used.

| substrate | quantum dots |
| --- | --- |
| GaAs | In(Ga)As |
| InP | In(Ga)As |
| GaAs | GaSb |
| GaAs | GaInP |
| sapphire | In(Ga)N |
| SiC | In(Ga)N |
| InGaAs | In(Ga)As |
| Si | (Si)Ge |

Further, the present invention is not limited to the embodiments described heretofore but various variations and modifications may be made without departing from the scope of the present invention.

What is claimed is:

1. An optical processor of a wavelength-division multiplexed optical signal comprising:

a semiconductor substrate having a first conductivity type;

a quantum semiconductor device formed on said semiconductor substrate;

a first optical waveguide formed on said semiconductor substrate in optical coupling with said quantum semiconductor device; and a second optical waveguide formed on said semiconductor substrate in optical coupling with said quantum semiconductor device, said quantum semiconductor device comprising:

a first cladding layer of said first conductivity type formed on said semiconductor substrate;

an undoped active layer formed on said first cladding layer;

a second cladding layer of a second, opposite conductivity type formed o said undoped active layer;

a first ohmic electrode connected electrically to said semiconductor substrate; and a second ohmic electrode connected electrically to said second cladding layer, said first optical waveguide making an optical coupling with said active layer, said first optical waveguide guiding a wavelength-division multiplexed optical signal incident thereto to said active layer, said second optical waveguide making an optical coupling with said active layer, said second optical waveguide guiding said wavelength-division multiplexed optical signal processed in said active layer to an output end of said second optical waveguide, said undoped active layer comprising:
an undoped compound semiconductor layer having a bandgap smaller than any of said first and second cladding layers and a plurality of mutually separated quantum dots formed inside said undoped compound semiconductor layer with a bandgap smaller than said bandgap of said undoped compound semiconductor layer.

2. An optical processor as claimed in claim 1, wherein each of said quantum dots has a composition forming a strained heteroepitaxial system with respect to said semiconductor substrate.

3. An optical processor as claimed in claim 1, wherein said plurality of quantum dots have respective optical absorption wavelengths pertinent thereto, said plurality of quantum dots collectively forming a continuous optical absorption spectrum.

4. An optical processor as claimed in claim 1, wherein said semiconductor substrate further carries thereon a third optical waveguide in optical coupling with said active layer.

5. An optical processor of a wavelength-division multiplexed optical signal, comprising:

a clock extracting part supplied with a wavelength-division multiplexed optical signal for extracting optical clock signals therefrom;

an optical modulating part supplied with said optical clock signals and said wavelength-division multiplexed signals and producing a repeated wavelength-division multiplexed optical signal by modulating said optical clock signals with said wavelength-division multiplexed signals;

said clock extracting part comprising a laser diode having an active layer such that said active layer contains a plurality of self-organized quantum dots, said optical modulating part comprising a laser-diode amplifier having an active layer such that said active layer of said laser-diode amplifier contains a plurality of self-organized quantum dots.

6. An optical processor of a wavelength-division multiplexed optical signal, comprising:

a first optical waveguide formed on a semiconductor substrate, said first optical waveguide receiving an incoming wavelength-division multiplexed optical signal at a first end thereof and guiding said wavelength-division multiplexed optical signal to a second, opposite end;

a laser diode provided in said first optical waveguide at a first location, said laser diode having a first active layer containing therein a plurality of quantum dots having respective absorption wavelengths, said quantum dots collectively forming a continuous absorption spectrum in a wavelength band of said incoming wavelength-division multiplexed optical signal;

a laser-diode amplifier provided in said first optical waveguide at a second location closer to said second end with respect to said first location, said laser-diode amplifier having a second active layer containing therein a plurality of quantum dots having respective absorption wavelengths, said quantum dots in said second active layer collectively forming a continuous absorption spectrum in said wavelength band of said incoming wavelength-division multiplexed optical signal; and a second optical waveguide provided on said semiconductor substrate branched from said first optical waveguide at a third location between said first end and said first location, said second optical waveguide merging with said first optical waveguide at said second location so as to supply said incoming wavelength-division multiplexed optical signal, branched at said third location to said second active layer of said laser-diode amplifier.

7. An optical processor of a wavelength-division multiplexed optical signal, comprising:

an absorption-saturation device having an active layer containing therein a plurality of quantum dots, said quantum dots having respective optical absorption wavelengths, said absorption-saturation device being driven so as to show a saturation of optical absorption to an optical signal supplied to said active layer;

an input optical path leading an incoming wavelength-division multiplexed optical signal to said active layer of said absorption-saturation device;

an optical source producing and supplying continuous-wave optical signals with respective wavelengths corresponding to channels of said wavelength-division multiplexed optical signal to said active layer of said absorption-saturation device; and an output optical path provided to said absorption-saturation device so as to lead said continuous-wave optical signals of said optical source processed by said absorption-saturation device to an output end of said output optical path.

8. An optical processor of a wavelength-division multiplexed optical signal, comprising:

a first optical non-linear device having a first active layer containing therein a plurality of quantum dots having respective absorption wavelengths;

a second optical non-linear device having a second active layer containing therein a plurality of quantum dots having respective absorption wavelengths;

an input optical path leading an incoming wavelength-division multiplex optical signal to said first active layer of said first optical non-linear device;

an optical source producing and supplying continuous-wave optical signals with respective wavelengths corresponding to channels of said wavelength-division multiplexed optical signal to said first active layer of said first optical non-linear second optical non-linear device; and an output optical path merging said continuous-wave optical signals processed by said first optical non-linear device and said continuous-wave optical signals processed by said second optical non-linear device with each other.

9. An optical processor of a wavelength-division multiplexed optical signal comprising:
- a first laser-diode amplifier having a first active layer containing therein a plurality of quantum dots having respective absorption wavelengths;
- an input optical path leading an incoming wavelength-division multiplexed optical signal to said first active layer of said first laser-diode amplifier;
- a first multiple-wavelength optical source producing and supplying first continuous-wave optical signals with respective wavelengths corresponding to channels of said wavelength-division multiplexed optical signal to said first active layer of said first laser-diode amplifier, said first laser-diode amplifier thereby producing an optical output as a result of modulation of said first continuous-wave optical signals with said incoming wavelength-division multiplexed optical signal;
- a second laser-diode amplifier having a second active layer containing therein a plurality of quantum dots having respective absorption wavelengths, said second laser-diode amplifier being supplied with said optical output of said first laser-diode amplifier at said second active layer;
- a third laser-diode amplifier having a third active layer containing therein a plurality of quantum dots having respective absorption wavelengths;
- a second multiple-wavelength optical source producing and supplying second continuous-wave optical signals with respective wavelengths corresponding to channels of said wavelength-division multiplexed optical signal to said second active layer of said second laser-diode amplifier and to said third active layer of said third laser-diode amplifier; and
- an output optical waveguide merging said second continuous-wave optical signals produced by said second multiple-wavelength optical source and processed by said second laser-diode amplifier and said second continuous-wave optical signals produced by said second multiple-wavelength optical source and processed by said third laser-diode amplifier.

10. An optical noise-cut filter, comprising:
- a non-linear optical device having an active layer containing therein a plurality of quantum dots having respective absorption wavelengths;
- an input optical waveguide supplying an incoming wavelength-division multiplex optical signal to said active layer of said non-linear optical device; and
- an output optical waveguide having an output end and coupled optically to said active layer of said non-linear optical device, said output optical waveguide leading said wavelength-division multiplex optical signal to said output end after being processed in said non-linear optical device,
- said non-linear optical device showing a saturation absorption to an optical radiation supplied to said active layer.

11. A method of repeating a wavelength-division multiplexed optical signal, comprising the step of:
- introducing said wavelength-division multiplex optical signal to a non-linear optical device having an active layer containing therein a plurality of self-organized quantum dots.

* * * * *